United States Patent
Tochishita et al.

(10) Patent No.: US 7,086,934 B2
(45) Date of Patent: Aug. 8, 2006

(54) METHOD FOR TREATING SURFACES OF RARE EARTH METAL-BASED PERMANENT MAGNETS

(75) Inventors: Yoshimi Tochishita, Hyogo (JP); Kazuaki Okuno, Hyogo (JP); Nobuhiro Misumi, Hyogo (JP); Takeshi Nishiuchi, Osaka (JP)

(73) Assignee: Neomax Co., Ltd., Osaka (JP)

( * ) Notice: Subject to any disclaimer, the term of this patent is extended or adjusted under 35 U.S.C. 154(b) by 252 days.

(21) Appl. No.: 10/793,817

(22) Filed: Mar. 8, 2004

(65) Prior Publication Data

US 2005/0009451 A1 Jan. 13, 2005

Related U.S. Application Data

(62) Division of application No. 09/819,765, filed on Mar. 29, 2001, now Pat. No. 6,743,082.

(30) Foreign Application Priority Data

Mar. 31, 2000 (JP) .......................................... 2000-97673

(51) Int. Cl.
*B24C 1/10* (2006.01)

(52) U.S. Cl. .............................. 451/37; 451/38; 451/65; 72/53

(58) Field of Classification Search ................... 451/37, 451/38, 65; 72/53; 29/527.4; 148/302; 118/716; 427/127

See application file for complete search history.

(56) References Cited

U.S. PATENT DOCUMENTS

| | | | |
|---|---|---|---|
| 1,679,378 A | 8/1928 | Sanders | |
| 2,726,047 A | 12/1955 | Treshow | |
| 4,116,161 A | 9/1978 | Steube | |
| 4,224,356 A | 9/1980 | Singer | |
| 4,665,655 A | 5/1987 | Woodard | |
| 5,089,066 A * | 2/1992 | Hamada et al. | 148/302 |
| 5,355,638 A | 10/1994 | Hoffman | |
| 5,672,094 A | 9/1997 | Nishimura et al. | |
| 6,315,646 B1 * | 11/2001 | Hoyashita | 451/65 |
| 6,330,740 B1 * | 12/2001 | Krempels | 29/527.4 |
| 6,367,134 B1 | 4/2002 | Sanada et al. | |
| 6,399,147 B1 * | 6/2002 | Nishiuchi et al. | 427/127 |
| 6,872,260 B1 * | 3/2005 | Nishiuchi et al. | 118/716 |

FOREIGN PATENT DOCUMENTS

| | | |
|---|---|---|
| EP | 00263883 | 4/1988 |
| EP | 0596683 | 5/1994 |
| GB | 329800 | 5/1930 |
| GB | 1315462 | 5/1973 |
| JP | 11-347941 | 12/1999 |

\* cited by examiner

*Primary Examiner*—George Nguyen
(74) *Attorney, Agent, or Firm*—Armstrong, Kratz, Quintos, Hanson & Brooks, LLP

(57) ABSTRACT

A process for treating surfaces of rare earth metal-based permanent magnets, comprising removing an oxide layer formed on a surface of each of the permanent magnets using a blasting apparatus. The apparatus comprises a tubular barrel formed of a mesh net for accommodation of work pieces and supported circumferentially outside a center axis of a support member rotatable about the center axis, and an injection nozzle disposed to inject a blast material against the work pieces from the outside of the tubular barrel, wherein at least one of the tubular barrel and the support member is detachably mounted. The process further comprises removing the tubular barrel or the support member from the blasting apparatus and attaching the tubular barrel or the support member to a vapor deposited film forming apparatus, where a metal film is formed on the surface of each of the permanent magnets by a vapor deposition process.

2 Claims, 5 Drawing Sheets

METHOD FOR TREATING SURFACES OF RARE EARTH METAL-BASED PERMANENT MAGNETS

CROSS REFERENCE TO RELATED APPLICATION

This application is a division of Ser. No. 09/819,765, filed Mar. 29, 2001 U.S. Pat. no. 6,743,082.

BACKGROUND OF THE INVENTION

1. Field of the Invention

The present invention relates to a blasting apparatus suitable for carrying out a surface treatment of sintered products such as rare earth metal-based permanent magnets and ceramics.

2. Description of the Related Art

A blasting apparatus is conventionally used for a surface treatment of, for example, rare earth metal-based permanent magnets, i.e., a treatment for removing an oxide layer formed on the surface, a treatment for cleaning the surface or a shot peening for finishing a film formed on the surface.

There are various types of blasting apparatus. For example, in a tumbler-type blasting apparatus, work pieces are placed into a drum within the apparatus, and an injection nozzle is disposed so as to inject a blast material against the work pieces through an opening in the drum, while stirring the work pieces by rotating the drum (see Japanese Patent Application Laid-open No.11-347941).

A blasting apparatus as described above is capable of mass-treatment of work pieces and excellent in productivity. In such apparatus, however, the injection of the blast material against the work pieces can be conducted only through the opening in the drum, and hence, there is, of course, a limit in respect of the treating efficiency. When an attempt is made to stir the work pieces as homogenously as possible by prolonging the treating period of time or by increasing the rotational speed of the drum in order to enhance the treating efficiency, the collision of the workpieces against one another occur frequently and with a strong shock force. For this reason, a cracking and breaking is produced in many of the work pieces. The stirring of the work pieces must be carried out, so that they are not dropped out through the opening and hence, the setting of the stirring condition is accompanied by a limitation. Further, it is necessary to place and remove the work pieces into and out of the drum before and after the treatment and hence, during the placing and removal, a cracking and breaking may be caused in the work pieces.

SUMMARY OF THE INVENTION

Accordingly, it is an object of the present invention to provide a blasting apparatus, which is excellent in treating efficiency of work pieces, and in which the occurrence of the cracking and breaking of the work pieces can be inhibited.

To achieve the above object, according to a first aspect and feature of the present invention, there is provided a blasting apparatus, comprising a tubular barrel formed of a mesh net for accommodation of work pieces and rotatable about a center axis, and an injection nozzle disposed to inject a blast material against the work pieces from the outside of the tubular barrel.

According to a second aspect and feature of the present invention, in addition to the first feature, the inside of the tubular barrel is divided into two or more accommodating sections.

According to a third aspect and feature of the present invention, in addition to the second feature, the inside of the tubular barrel is divided radiately from the center axis into two or more accommodating sections.

According to a fourth aspect and feature of the present invention, in addition to the first feature, the tubular barrel is detachably mounted.

According to a fifth aspect and feature of the present invention, there is provided a blasting apparatus, comprising a tubular barrel formed of a mesh net for accommodation of work pieces and supported circumferentially outside a center axis of a support member rotatable about the center axis, for rotation about the center axis, so that the tubular barrel can be rotated about the center axis of the support member by rotating the support member, and an injection nozzle disposed to inject a blast material against the work pieces from the outside of the tubular barrel rotated about the center axis.

According to a sixth aspect and feature of the present invention, in addition to the fifth feature, a plurality of the tubular barrels are supported in an annular shape circumferentially outside the center axis of the support member.

According to a seventh aspect and feature of the present invention, in addition to the fifth feature, the tubular barrel and/or the support member for supporting the tubular barrel is detachably mounted.

According to an eighth aspect and feature of the present invention, there is provided a process for blasting surfaces of work pieces using a blasting apparatus according to the first or fifth feature.

According to a ninth aspect and feature of the present invention, in addition to the eighth feature, the work pieces are rare earth metal-based permanent magnets.

According to a tenth aspect and feature of the present invention, there is provided a process for treating the surfaces of rare earth metal-based permanent magnets, comprising the steps of removing an oxide layer formed on the surface of each of the rare earth metal-based permanent magnets using a blasting apparatus according to the fourth or seventh feature, removing the tubular barrel containing the rare earth metal-based permanent magnets with the oxide layers removed therefrom, or the support member for supporting the tubular barrel from the blasting apparatus, and attaching the tubular barrel or the support member to a vapor deposited film forming apparatus, where a metal film is formed on the surface of each of the rare earth metal-based permanent magnets by a vapor deposition process.

According to an eleventh aspect and feature of the present invention, in addition to the tenth feature, the process further includes a step of removing the tubular barrel containing the rare earth metal-based permanent magnets having the metal films formed thereon, or the support member for supporting the tubular barrel from the vapor deposited film forming apparatus, and attaching the tubular barrel or the support member again to the blasting apparatus according to the fourth or seventh feature, where the metal films are subjected to a shot peening.

With the blasting apparatus according to the first feature of the present invention (a first embodiment of the present invention) in which the injection nozzle is disposed to inject the blast material against the work pieces from the outside of the tubular barrel formed of the mesh net for accommodation of the work pieces and rotatable about the center axis, the work pieces can be stirred homogenously and efficiently without excessive occurrence of the collision of the work pieces against one another and without occurrence of the collision of the work pieces against one another with a strong shock force. Therefore, the treating efficiency is enhanced and moreover, it is possible to inhibit the occurrence of the cracking and breaking of the work pieces. Since the tubular barrel is formed of the mesh net, the blast material can be injected from all directions. Therefore, any number of injection nozzles for injecting the blast material can be disposed at any locations in any manner, so that the blast material can be injected uniformly and efficiently against the work pieces.

With the blasting apparatus according to the fifth feature of the present invention (a second embodiment of the present invention) in which the tubular barrel formed of the mesh net for accommodation of the work pieces and supported circumferentially outside the center axis of the support member rotatable about the center axis, for rotation about the center axis, so that the tubular barrel can be rotated about the center axis of the support member by rotating the support member, and the injection nozzle is disposed to inject the blast material against the work pieces from the outside of the tubular barrel rotated about the center axis, it is possible to more inhibit the occurrence of the cracking and breaking of the work pieces, in addition to the effect provided in the blasting apparatus according to the first feature of the present invention.

The above and other objects, features and advantages of the invention will become apparent from the following description of the preferred embodiment taken in conjunction with the accompanying drawings.

DETAILED DESCRIPTION OF THE INVENTION

The present invention will now be described by way of embodiments with reference to the accompanying drawings.

Typical examples of work pieces subjected to a surface treatment using a blasting apparatus according to the present invention are sintered products such as rare earth metal-based permanent magnets and ceramics liable to be cracked and broken. However, the workpiece is not limited to these sintered products, and may be any piece, if the surface treatment of such a piece can be achieved by a blasting treatment. For example, the work piece may be a piece liable to be deformed due to the collision of them against one another, such as a casting aluminum. If the surface treatment of such work pieces is conducted using the blasting apparatus according to the present invention, an effect of inhibiting the deformation can be provided.

Examples of blast materials used in the blasting apparatus according to the present invention are metallic blast materials such as steel shots and non-metallic blast materials such as Alundum (a trade name of Norton Co.,) and glass beads, any one of which is selected properly depending on the treating purpose.

A blasting apparatus according to a first embodiment of the present invention will now be described. This apparatus includes a tubular barrel formed of a mesh net for accommodation of workpieces and rotatable about a center axis, and an injection nozzled is posed to inject a blast material against the workpieces from the outside of the tubular barrel. The outlines of several examples of the blasting apparatus will be described below with the drawings.

Figure 1:
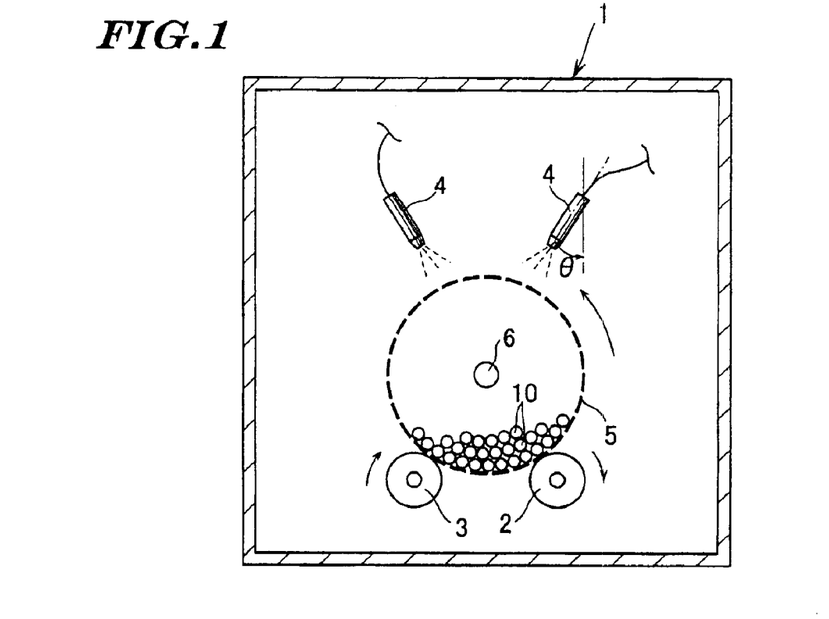
FIG. 1 is a diagrammatic front view of the inside of one example of a blasting apparatus according to a first embodiment of the present invention.
Figure 2:
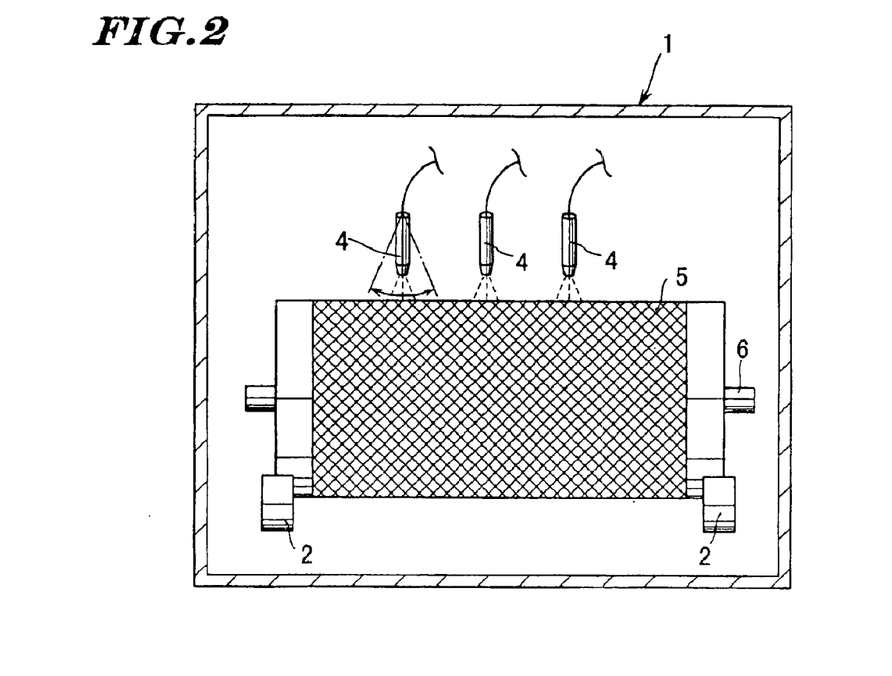
FIG. 2 is a diagrammatic side view of the inside of the one example of the blasting apparatus according to the first embodiment of the present invention.

A blasting apparatus shown in FIGS. 1 and 2 is of a type in which the inside of a tubular barrel is not divided. FIG. 1 is a diagrammatic front view (a partially perspective view) of the inside of the blasting apparatus 1. A cylindrical barrel 5 formed of a mesh net of a stainless steel disposed in a lower area in the apparatus is constructed, so that it is rotated about a center axis by rotating rollers 2 and 3 by driving a motor (not shown) to stir work pieces 10 in the barrel 5 homogenously and efficiently (see an arrow in FIG. 1). A total of six injection nozzles 4 for injecting a blast material against work pieces 10 in the cylindrical barrel 5 are disposed above the cylindrical barrels in two rows in a longitudinal direction of the barrel at an appropriate injection angle θ (usually in a range of 20° to 30°). If a central support shaft 6 is provided on the center axis, it is convenient when the cylindrical barrel is removed from the apparatus and moved. FIG. 2 is a diagrammatic side view of the inside of the blasting apparatus 1. The individual injection nozzle 4 has an appropriate angle of oscillation in the longitudinal direction of the cylindrical barrel 5 and hence, is capable of injecting the blast material uniformly and efficiently against all the work pieces 10 (not shown in FIG. 2) in the barrel.

Figure 3:
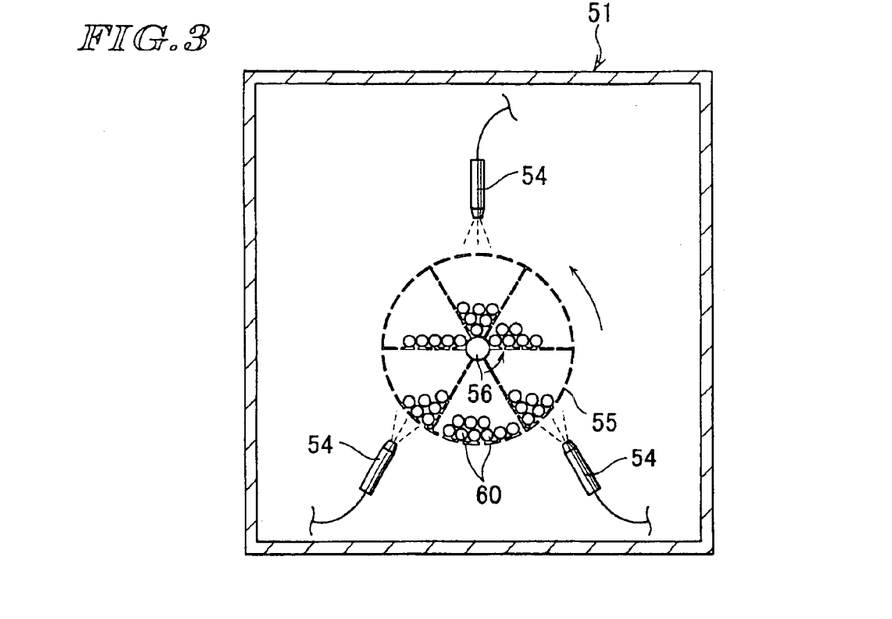
FIG. 3 is a diagrammatic front view of the inside of another example of a blasting apparatus according to the first embodiment of the present invention.
Figure 4:
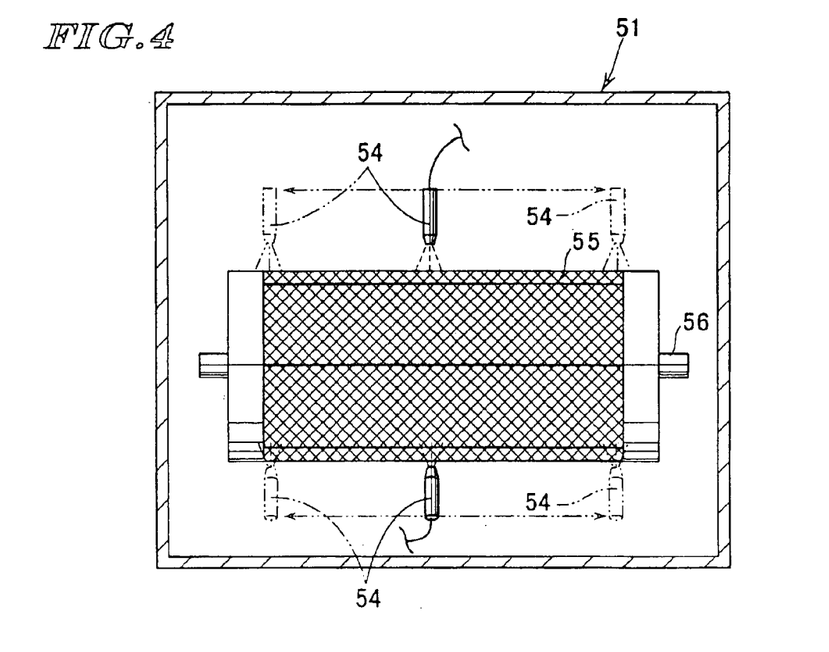
FIG. 4 is a diagrammatic side view of the inside of the another example of the blasting apparatus according to the first embodiment of the present invention.

A blasting apparatus shown in FIGS. 3 and 4 is of a type in which the inside of a tubular barrel is divided into two or more accommodating sections. FIG. 3 is a diagrammatic front view (a partially perspective view) of the inside of the blasting apparatus 51. In this apparatus 51, the inside of a cylindrical barrel 55 is divided radiately from a center axis into six accommodating sections fan-shaped in section. The blasting apparatus 51 is constructed so that the cylindrical barrel 55 is rotated about the center axis by rotating the central support shaft 56 on the center axis by driving a motor (not shown), whereby work pieces 60 in the barrel are stirred homogeneously and efficiently (see an arrow in FIG. 3), unlike the blasting apparatus shown in FIGS. 1 and 2. A total of three injection nozzles 54 for injecting a blast material against the work pieces 60 in the cylindrical barrel 55 are disposed in such a manner that one of the injection nozzles 54 is located above the barrel 55, other one of the injection nozzles 54 is located on the right of and below the barrel 55, and remaining one of the injection nozzles 54 is located on the left of and below the barrel 55. FIG. 4 is a diagrammatic side view of the inside of the blasting apparatus 51. The injection nozzles 54 are movable in the longitudinal direction of the cylindrical barrel 55 and hence, are capable of injecting the blast material uniformly and efficiently against all of the work pieces 60 (not shown in FIG. 4) in the barrel.

With the blasting apparatus according to the first embodiment of the present invention, the accommodation of the work pieces in the tubular barrel formed of the mesh net ensures that the work pieces can be stirred homogenously and efficiently in a state in which they are less piled up one on another without excessive occurrence of the collision of the work pieces against one another and without occurrence of the collision of the work pieces against one another with a strong shock force. Therefore, the area of work piece blasted per unit time is increased and hence, the treating efficiency is enhanced and moreover, it is possible to inhibit the occurrence of the cracking and breaking of the work pieces.

Since the tubular barrel is formed of the mesh net, the blast material can be injected from all directions. Therefore, any number of injection nozzles for injecting the blast material can be disposed at any locations in any manner, so that the blast material can be injected uniformly and efficiently against the work pieces. In addition, the blasting treatment can be carried out with an excellent treating efficiency and hence, can be achieved at an injection pressure lower than that in the prior art. Therefore, the load of a compressor can be reduced, and an increase in power efficiency can be provided.

After the blasting of the work pieces, it is desirable that the blast material deposited on the surfaces of the work pieces and on the tubular barrel is removed by blowing of air under conditions, for example, of a pressure in a range of 0.1 MPa to 0.5 MPa and of a treating time in a range of 1 minute to 3 minutes. Since the tubular barrel is formed of the mesh net, the blast material can be removed easily, and if the treatment is carried out while rotating the tubular barrel, the blast material can be removed more efficiently.

In addition, the work pieces are stirred in the state in which they have been accommodated in the tubular barrel, and hence, the work pieces cannot be dropped out through an opening, as is the case when a conventional tumbler-type apparatus.

If the inside of the tubular barrel is divided into two or more accommodating sections as in the blasting apparatus shown in FIGS. 3 and 4, even when the same amount of work pieces are to be subjected to the blasting treatment, the work pieces can be placed in a smaller amount into each of the accommodating sections rather than in a larger amount into a single tubular barrel. In this case, the frequency of collision of the work pieces against one another can be more reduced, and the collision energy can be reduced and hence, the work pieces can be stirred homogeneously and efficiently in a state in which they are less piled up one on another. Therefore, it is possible to more inhibit the occurrence of the cracking and breaking of the work pieces. Partitions for defining the accommodating sections are desirable to be net-shaped.

The provision of the tubular barrel detachable and easy to handle provides the following advantages:

First, the placing and removal of the work pieces into and out of the tubular barrel can be carried out at any site and hence, it is possible to enhance the convenience.

In the surface treatment of rare earth metal-based permanent magnets, the single tubular barrel can be used consistently at a plurality of steps.

More specifically, it is possible to sequentially carry out the following steps: a step of removing an oxide layer formed on the surface of each of the rare earth metal-based permanent magnets using this blasting apparatus, a step of removing, from the blasting apparatus, the tubular barrel in which the rare earth metal-based permanent magnets with the oxide layers removed therefrom have been contained, a step of attaching the tubular barrel to a vapor deposited film forming apparatus to form a metal film such as an aluminum film on the surface of each of the rare earth metal-based permanent magnets by a vapor deposition process, a step of removing, from the vapor deposited film forming apparatus, the tubular barrel in which the rare earth metal-based permanent magnets having the metal films formed thereon have been contained, a step of attaching the tubular barrel again to the blasting apparatus to subject the metal film to a shot peening, a step of removing, from the blasting apparatus, the tubular barrel in which the rare earth metal-based permanent magnets having the metal films subjected to the shot peening have been contained, a step of immersing the tubular barrel into a chemical conversion-treating liquid (for example, a chemical conversion-treating liquid for a chromating treatment described in Japanese Patent Publication No.6-66173 or for a zirconium-phosphate treatment described in Japanese Patent Application Laid-open No.2000-150216) in a state in which the rare earth metal-based permanent magnets have been contained in the tubular barrel (wherein the tubular barrel may be rotated in the chemical conversion-treating liquid in order to form a more uniform film), and a step of pulling the tubular barrel up, thereby forming a chemical conversion film on the surface of each of the metal films.

In addition, after the step of removing an oxide layer formed on the surface of each of the rare earth metal-based permanent magnets using this blasting apparatus, it is possible to carry out a step of removing, from the blasting apparatus, the tubular barrel in which the rare earth metal-based permanent magnets with the oxide layers removed therefrom have been contained, a step of immersing the tubular barrel into a chemical conversion-treating liquid (for example, a chemical conversion-treating liquid for a phosphate treatment or a chromating treatment described in Japanese Patent Application Laid-open No.60-63903) in a state in which the rare earth metal-based permanent magnets have been contained in the tubular barrel (wherein the tubular barrel may be rotated in the chemical conversion-treating liquid in order to form a more uniform film), and a step of pulling the tubular barrel up, thereby forming a chemical conversion film on the surface of each of the magnets.

As long as the tubular barrel can be consistently used, the tubular barrel may be used at another step carried out between the above-described steps.

Therefore, the need for carrying out an operation for transferring the magnets between the steps is eliminated and hence, it is possible to inhibit the occurrence of the cracking and breaking of the magnets, which may be caused during transferring of the magnets and in addition, to eliminate labor for the transferring operation.

If a plurality of tubular barrels having the same shape are prepared and put into continuous service, the tubular barrel X passed through a B step can be transferred to a C step and then, the tubular barrel Y passed through an A step can be transferred to the B step. Therefore, all of the steps can be conducted smoothly and hence, the time required for all of the steps can be shortened. Especially, the blasting step and the blast material removing step by blowing of air, as described above, have been carried out in the same treating chamber in the prior art. However, if the tubular barrels are detachable and easy to handle, both of these steps can be carried out in different treating chambers adjoining each other, and while the blast material removing step is being conducted in the tubular barrel X, the blasting step can be conducted in the tubular barrel Y. Therefore, it is possible to reduce the time period required for the blast material removing step and occupied in the time period required for all of the steps.

The deposition of a vapor deposition material such as aluminum to the tubular barrel to a moderate extent inhibits the damaging (including the wearing, the reduction in strength and the peeling-off of a welded zone) of the mesh net forming the tubular barrel at the blasting step and the blast material removing step and hence, it is possible to prolong the time of durability of the tubular barrel.

In addition, the vapor deposition material such as aluminum and the blast material deposited to the tubular barrel to an excessive extent can be removed at the blasting step and the blast material removing step. Therefore, it is possible to prolong the time of durability of the tubular barrel, and to inhibit foreign matters deposited to the barrel during formation of a metal film by the vapor deposition process from being deposited to the surface of each of the work pieces to produce projections.

The shape of the barrel is not limited to the cylindrical shape, and the barrel may be polygonal in section such as hexagonal and octagonal, if it is tubular. If the shape of the tubular barrel is not cylindrical, the barrel cannot be rotated smoothly using a roller as in the blasting apparatus shown in FIGS. 1 and 2. Therefore, the rotation of the barrel may be conducted by rotating the central support shaft as in the blasting apparatus shown in FIGS. 3 and 4.

Net-shaped dividing walls may be provided vertically in the longitudinal direction within the tubular barrel (the accommodating section), so that one work piece may be accommodated in each of partitioned chamber portions defined by the dividing walls, whereby the work pieces may be subjected in spaced-apart states to the blasting treatment.

Examples of the mesh net forming the tubular barrel include those made of a stainless steel and titanium, but the mesh net made of titanium is desirable from a reduction in weight of the tubular barrel. The mesh net may be made using a net-shaped plate produced by punching or etching a flat plate, or may be made by knitting a linear material.

The opening rate of the mesh (the proportion of the area of an opening to the area of the mesh) depends on the shape and the size of a work piece, but is desirably in a range of 50% to 95%, more desirably in a range of 60% to 85%. If the opening rate is smaller than 50%, there is a possibility that the mesh itself is an obstacle between the injection nozzle and the work piece, resulting in a reduced treating efficiency. If the opening rate is larger than 95%, there is a possibility that the mesh is deformed or damaged during the treatment or during another handling. The wire diameter of the mesh is selected in consideration of the opening rate and the strength, and is desirable to be in a range of 0.1 mm to 10 mm. Further, if the handling ease is taken into consideration, the wire diameter of the mesh is desirable to be in a range of 0.3 mm to 5 mm.

A blasting apparatus according to a second embodiment of the present invention will now be described. This apparatus includes a tubular barrel formed of a mesh net for accommodation of work pieces and supported circumferentially outside a center axis of a support member rotatable about the center axis, for rotation about the center axis, so that the tubular barrel can be rotated about the central axis of the support member, and an injection nozzle disposed to inject a blast material against the work pieces from the outside of the tubular barrel rotated about the center axis. The outline of one example of the blasting apparatus will be described below with the drawings.

Figure 5:
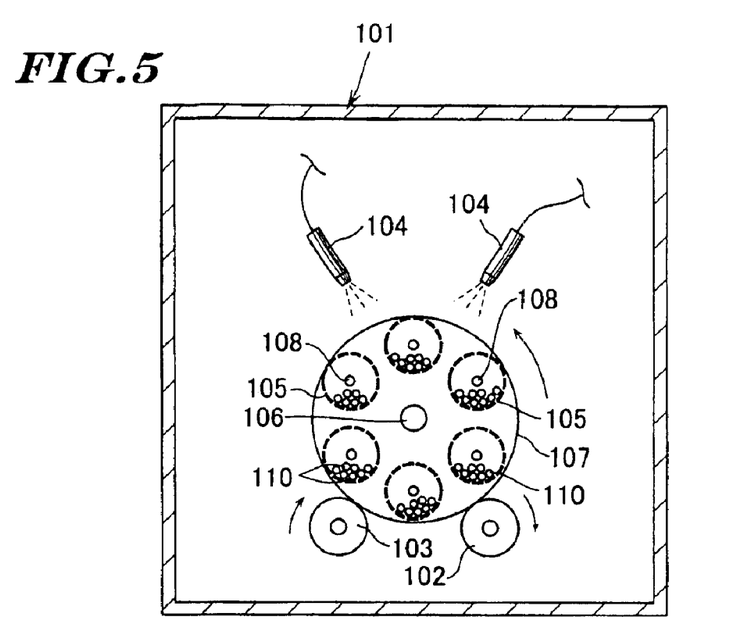
FIG. 5 is a diagrammatic front view of the inside of one example of a blasting apparatus according to a second embodiment of the present invention.
Figure 6:
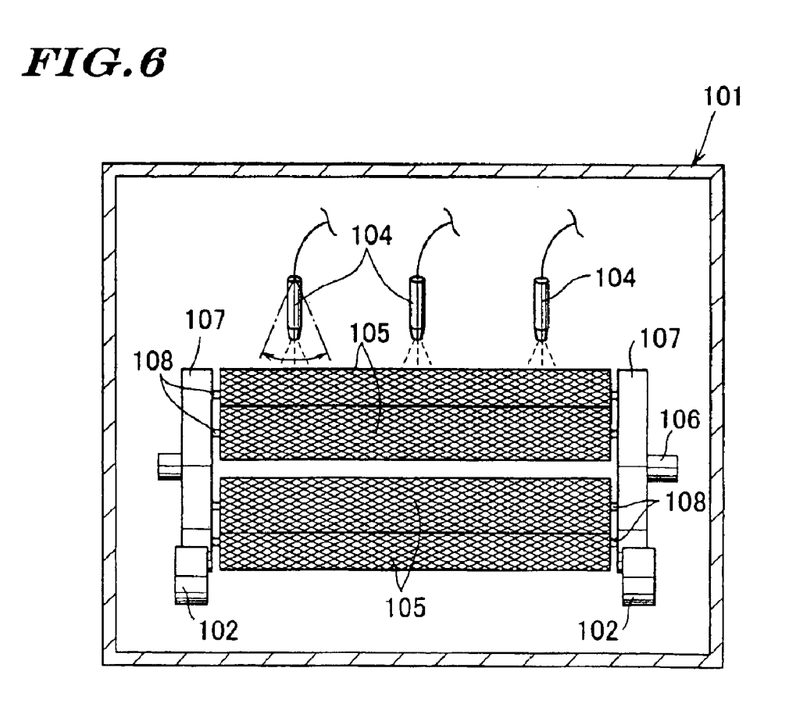
FIG. 6 is a diagrammatic side view of the inside of the one example of the blasting apparatus according to the second embodiment of the present invention.

FIG. 5 is a diagrammatic front view (a partially perspective view) of the inside of a blasting apparatus 101. Support member 107 rotatable about a center axis is supported on rollers 102 and 103 in a lower area in the apparatus, and six cylindrical barrels 105 formed of a mesh net of a stainless steel are supported in an annular shape circumferentially outside the center axis of the support member by support shaft 108 for rotation about the center axis. When the support member 107 is rotated about the center axis by rotating the rollers 102 and 103 by driving a motor (not shown), the cylindrical barrel 105 supported by the support shaft 108 is rotated about the center axis in response to the rotation of the support member 107, whereby work pieces 110 within the barrel are stirred homogenously and efficiently (see an arrow in FIG. 5). A total of six injection nozzles 104 for injecting a blast material against the work pieces 110 in the cylindrical barrel 105 are disposed above the cylindrical barrel 105 in two rows in a longitudinal direction of the barrel at an appropriate injection angle, as in the blasting apparatus shown in FIGS. 1 and 2. If a central support shaft 106 is provided on the center axis of the support member 107, it is convenient when the support member 107 supporting the cylindrical barrel is removed from the apparatus and moved. FIG. 6 is a diagrammatic side view of the inside of the blasting apparatus 101. The individual injection nozzle 104 has an appropriate angle of oscillation in the longitudinal direction of the cylindrical barrel 105 and hence, is capable of injecting the blast material uniformly and efficiently against all the work pieces 110 (not shown in FIG. 6) in the barrel, as in the blasting apparatus shown in FIGS. 1 and 2.

Figure 7:
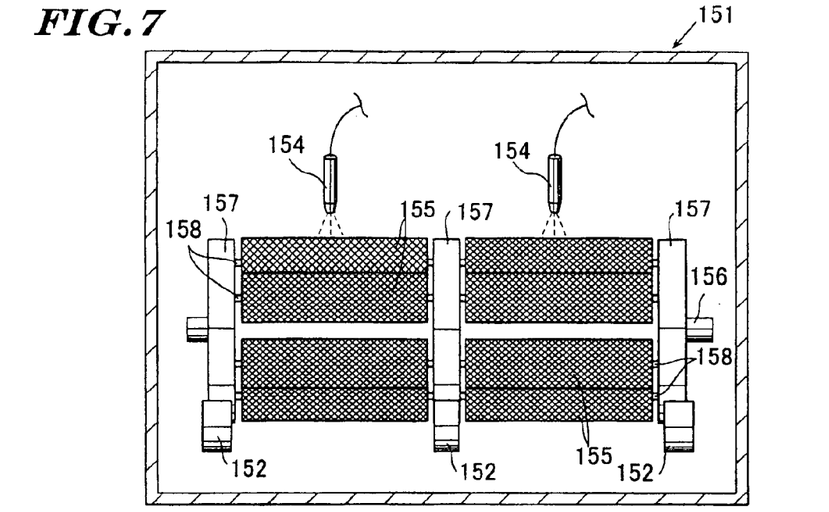
FIG. 7 is a diagrammatic side view of the inside of another example of a blasting apparatus according to the second embodiment of the present invention.
Figure 8:
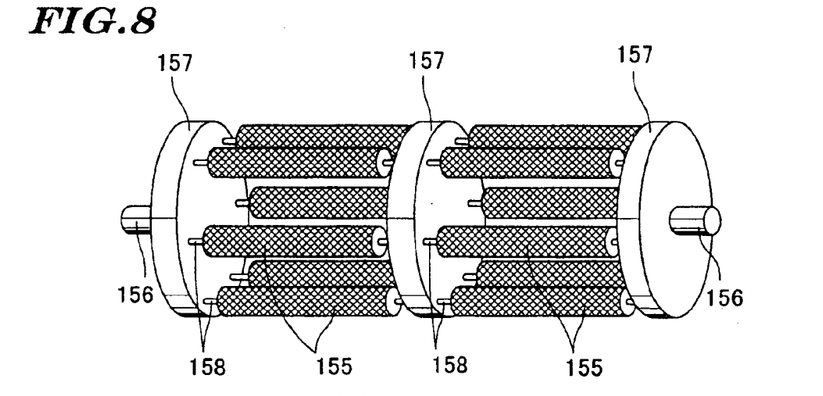
FIG. 8 is a diagrammatic perspective view showing the embodiment with the cylindrical barrels supported on the support members in the blasting apparatus shown in FIG. 7.

FIG. 7 is a diagrammatic side view of the inside of another example of a blasting apparatus 151. As in this apparatus 151, two series of the six cylindrical barrels supported on the support members provided at opposite ends in the blasting apparatus shown in FIGS. 5 and 6 (the twelve cylindrical barrels 55) may be supported on support members 157, and a single injection nozzle 154 may be disposed for each of the two series. FIG. 8 is a diagrammatic perspective view showing the embodiment with the cylindrical barrels 155 supported on the support members 157.

Figure 9:
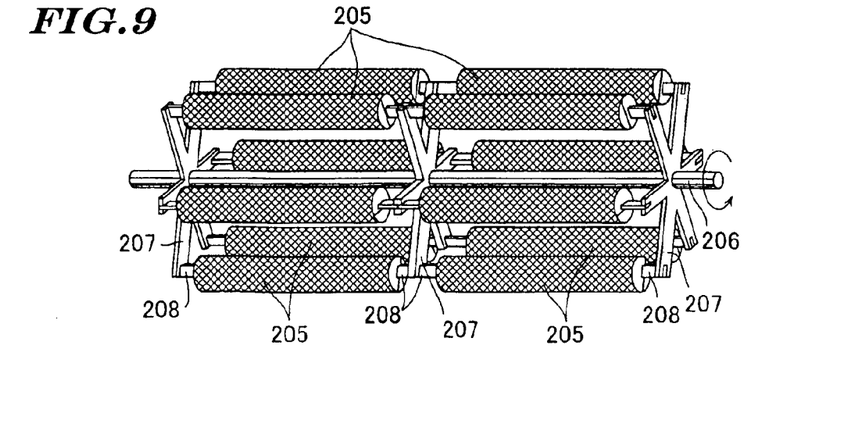
FIG. 9 is a diagrammatic perspective view showing an embodiment other than the embodiment with the cylindrical barrels supported on the support members shown in FIG. 8.

FIG. 9 is a diagrammatic perspective view showing an embodiment other than the embodiment with the cylindrical barrels supported on the support members shown in FIG. 8. Six cylindrical barrels 205 formed of a mesh net of a stainless steel are supported in an annular shape circumferentially outside a horizontal central support shaft 206, i.e., the central support shaft 206 of a support member 207 by a support shaft 208 for rotation about the center axis, so that they can be rotated about the center axis (the cylindrical barrels are supported in two series and hence, the total number of the cylindrical barrels supported is twelve) (work pieces are still not accommodated).

Figure 10:
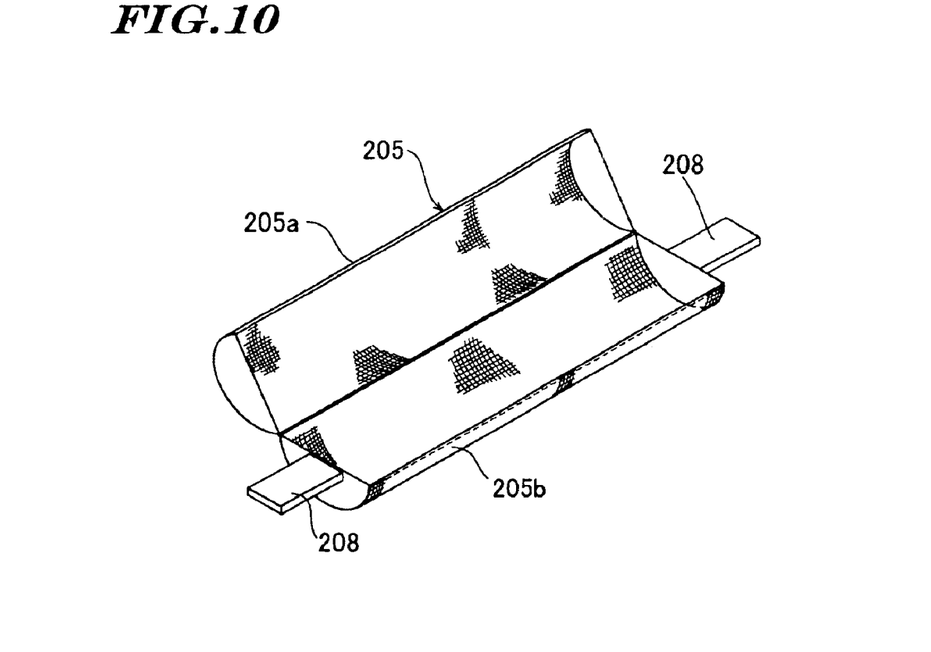
FIG. 10 is a diagrammatic perspective view of the cylindrical barrel used in the embodiment shown in FIG. 9.

FIG. 10 is a diagrammatic perspective view of the cylindrical barrel 205 used in the embodiment shown in FIG. 9. The cylindrical barrel 205 is capable of being opened and closed in a longitudinal direction and comprises an upper cage portion 205a and a lower cage portion 205b formed as symmetrical elements capable of being opened and closed through a hinge (not shown). The cylindrical barrel 205 has a support shaft 208 for being supported by the support member 207. If such a cylindrical barrel 205 is used, it is possible to easily conduct the placing and removal of work pieces into and out of the cylindrical barrel 205 and hence, it is possible to inhibit the occurrence of the cracking and breaking of the work pieces during the placing and removal of the work pieces into and out of the cylindrical barrel 205. During the blasting treatment, the upper and lower cage portions 205a and 205b are fastened to each other by a clip (not shown). Net-shaped dividing walls may be provided vertically in the longitudinal direction within the cylindrical barrel 205, so that one work piece may be accommodated in each of partitioned chamber portions defined by the dividing walls, whereby the work pieces may be subjected in spaced-apart states to the blasting treatment.

Figure 11:
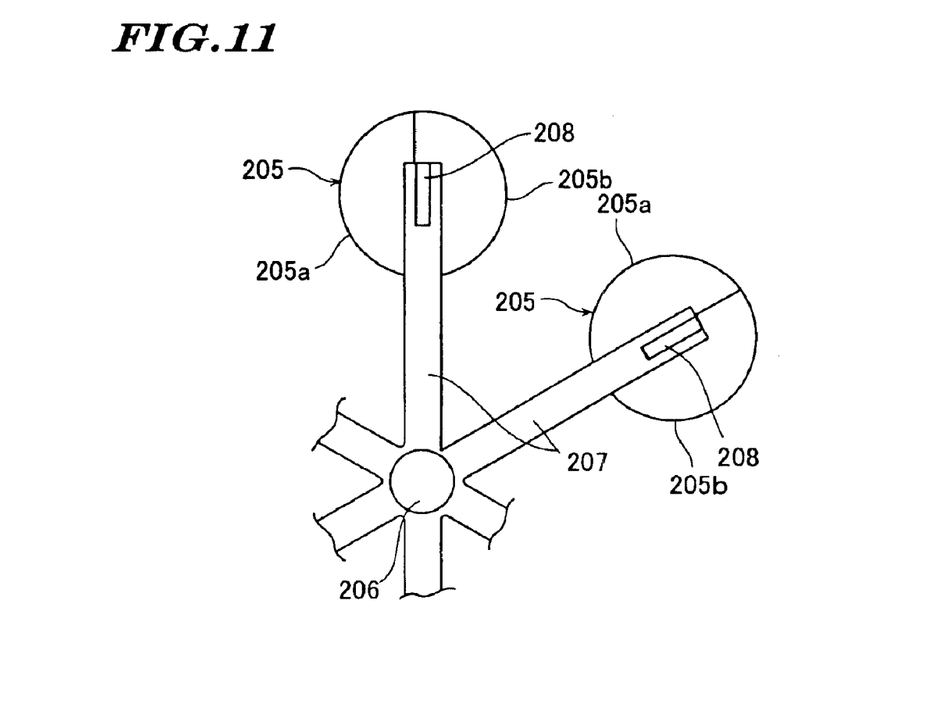
FIG. 11 is a diagrammatic partially front view showing how the cylindrical barrel is supported on the support member in the embodiment shown in FIG. 9.

FIG. 11 is a diagrammatic partially front view showing how the cylindrical barrel 205 is supported on the support member 207 in the embodiment shown in FIG. 9. The cylindrical barrel 205 is supported by clamping the support shaft 208 in the support member 207. It is desirable that the clamping of the support shaft 208 in the support member 207 is resiliently conducted, for example, as in a mechanism utilizing a repulsive force of a spring, so that the cylindrical barrel 205 is detachably supported on the support member 207.

Even with the blasting apparatus according to the second embodiment of the present invention, an effect similar to that in the blasting apparatus according to the first embodiment of the present invention can be provided. Advantages provided when the tubular barrel and/or the support member for supporting the tubular barrel is detachably mounted and easy to handle, are similar to the advantages described in the blasting apparatus according to the first embodiment of the present invention.

The blasting apparatus according to the second embodiment of the present invention has remarkable advantages which will be described below.

First, even when the same amount of work pieces are to be subjected to the blasting treatment, the work pieces can be placed in a smaller amount in to each of the smaller tubular barrels rather than in a larger amount in to a single larger tubular barrel. In this case, the frequency of collision of the workpieces against one another can be more reduced, and the collision energy can be reduced and hence, the workpieces can be stirred homogeneously and efficiently in a state in which they are less piled up one on another. Therefore, it is possible to more inhibit the occurrence of the cracking and breaking of the work pieces.

Work pieces having different shapes or work pieces having different sizes can be accommodated in each of the tubular barrels, respectively, and the tubular barrels are fixed in an annular shape circumferentially outside the center axis of the support member to carry out the blasting treatment. Therefore, the blasting treatments of a plurality of types of work pieces can be carried out at one time.

A plurality of tubular barrels having different mesh shapes are used in combination with one another and fixed in an annular shape circumferentially outside the center axis of the support member to carry out the blasting treatment, whereby the treating efficiency can be varied for every tubular barrels. Therefore, the work pieces accommodated in each of the tubular barrels can be treated to different extents, respectively.

In the blasting apparatus shown in FIGS. 5 and 6 and the blasting apparatus shown in FIG. 7, the six cylindrical barrels are supported on one surface of one of the support members (in the blasting apparatus shown in FIG. 7, the cylindrical barrels are supported in two series and hence, the total number of the cylindrical barrels supported is twelve), but the number of the tubular barrels supported on one of the support members is not limited to six and may be one.

The tubular barrel may be supported, so that by rotating the support member, it can be rotated about the center axis and can be also rotated about its axis by a known mechanism.

The shape of the tubular barrel and the construction of the mesh net are as described for the blasting apparatus according to the first embodiment of the present invention. The inside of the tubular barrel may be divided radiately from the center axis into two or more accommodating sections, as in the blasting apparatus shown in FIGS. 3 and 4.

When an oxide layer formed on each of rare earth metal-based permanent magnets is to be removed, or a metal film formed on the surface of each of rare earth metal-based permanent magnets by a vapor deposition process is to be subjected to a shot peening for a finishing treatment, using the blasting apparatus according to the present invention, if the blast material is injected under an injection pressure in a range of 0.1 MPa to 0.5 MPa, while rotating the tubular barrel in the blasting apparatus according to the first embodiment of the present invention, or the support member in the blasting apparatus according to the second embodiment of the present invention at a rotational speed in a range of 0.5 rpm to 30 rpm (desirably in a range of 1 rpm to 10 rpm), the surface treatment of the rare earth metal-based permanent magnets can be carried out uniformly and efficiently.

EXAMPLES

The blasting apparatus according to the present invention will be further described in detail by way of following examples, but it will be understood that the blasting apparatus according to the present invention is not limited to such examples.

The following examples were carried out using sintered magnets having a composition of 14Nd—79Fe—6B—1Co and a size of 30 mm×15 mm×6 mm, and produced by pulverizing a known cast ingot and then subjecting the resulting powder to a pressing, a sintering, a heat treatment and a surface working, for example, as described in U.S. Pat. Nos. 4,770,723 and 4,792,368 (such sintered magnets will be referred to as magnet test pieces hereinafter).

Example 1

First Example of Removal of Oxide Layer Formed on Surface of Magnet Test Piece (Condition)

The removal of an oxide layer formed on the surface of each of magnet test pieces was carried out using the blasting apparatus shown in FIGS. 1 and 2. The cylindrical barrel used in Example 1 was made of a stainless steel at a diameter of 355 mm and a length of 600 mm and had an opening rate of a mesh of 70% (an opening was square with a length of one side equal to 5.1 mm and with a wire diameter of 1.0 mm). 414 Magnet test pieces were placed into the cylindrical barrel. Alundum A#180 (made by Sinto Brator Co., Ltd and having a grain size of #180 according to JIS) was used as a blast material and injected under an injection pressure of 0.2 MPa for 20 minutes, while rotating the cylindrical barrel at 5 rpm.

(Result)

After the blast material was injected for 20 minutes, the ten magnet test pieces were removed from the cylindrical barrel and subjected to a surface observation using a scanning electron microscope. The result showed that there was no magnet test piece having the oxide layer left on the surface thereof. In addition, five of the 414 magnet test pieces each had a cracking and breaking.

Example 2

Second Example of Removal of Oxide Layer Formed on Surface of Magnet Test Piece (Condition)

The removal of an oxide layer formed on the surface of each of magnet test pieces was carried out using the blasting apparatus shown in FIGS. 3 and 4. The cylindrical barrel used in Example 2 was made of a stainless steel at a diameter of 355 mm and a length of 600 mm and had an opening rate of a mesh of 70% (an opening was square with a length of one side equal to 5.1 mm and with a wire diameter of 1.0 mm). The inside of the cylindrical barrel was divided radiately from the center axis into six accommodating sections fan-shaped in section. 69 Magnet test pieces were placed into each of the accommodating sections of the cylindrical barrel (a total of 414 magnet test pieces were accommodated in the entire cylindrical barrel). Alundum A#180 (made by Sinto Brator Co., Ltd and having a grain size of #180 according to JIS) was used as a blast material and injected under an injection pressure of 0.2 MPa for 15 minutes, while rotating the cylindrical barrel at 5 rpm.

(Result)

After the blast material was injected for 15 minutes, the ten magnet test pieces were removed from the cylindrical barrel and subjected to a surface observation using a scanning electron microscope. The result showed that there was no magnet test piece having the oxide layer left on the surface thereof. In addition, two of the 414 magnet test pieces each had a cracking and breaking.

Example 3

Third Example of Removal of Oxide Layer Formed on Surface of Magnet Test Piece (Condition)

The removal of an oxide layer formed on the surface of each of magnet test pieces was carried out using the blasting apparatus shown in FIGS. 5 and 6. Each of the cylindrical barrels used in Example 3 was made of a stainless steel at a diameter of 110 mm and a length of 600 mm and had an opening rate of a mesh of 70% (an opening was square with a length of one side equal to 5.1 mm and with a wire diameter of 1.0 mm). 69 Magnet test pieces were placed into each of the cylindrical barrels (a total of 414 magnet test pieces were accommodated in the six cylindrical barrels). Alundum A#180 (made by Sinto Brator Co., Ltd and having a grain size of #180 according to JIS) was used as a blast material and injected under an injection pressure of 0.2 MPa for 15 minutes, while rotating the support members at 5 rpm.

(Result)

After the blast material was injected for 15 minutes, the ten magnet test pieces were removed from the cylindrical barrels and subjected to a surface observation using a scanning electron microscope. The result showed that there was no magnet test piece having the oxide layer left on the surface thereof. In addition, one of the 414 magnet test pieces had a cracking and breaking.

Example 4

Shot Peening for Finishing Treatment of Aluminum Film Formed on Surface of Magnet Test Piece (Condition)

An oxide layer formed on the surface of each of the magnet test pieces was removed under the same conditions as in Example 1, and the cylindrical barrel containing the magnet test pieces with the oxide layers removed therefrom was removed from the blasting apparatus and attached to a vapor deposited film forming apparatus described in U.S. Pat. No. 4,116,161, where the magnet test pieces were subjected to a vapor deposition process, whereby an aluminum film having an average thickness of 7 μm was formed on the surface of each of the magnet test pieces. Then, the cylindrical barrel containing the magnet test pieces having the aluminum films formed on their surfaces was removed from the vapor deposited film forming apparatus and attached again to the blasting apparatus used in Example 1, where GB-AG (glass beads made by Sinto Brator Co., Ltd and having a grain size of #180 according to JIS) used as a blast material was injected under an injection pressure of 0.2 MPa for 15 minutes, while rotating the cylindrical barrel at 5 rpm.

(Result)

After the blast material was injected for 15 minutes, the ten magnet test pieces were removed from the cylindrical barrel and subjected to a surface observation using a scanning electron microscope. The result showed that there was no magnet test piece incompletely subjected to the shot peening, and all of the magnet test pieces exhibited a good corrosion resistance. Seven of the 414 magnet test pieces each had a cracking and breaking.

As described above, the cylindrical barrel containing the magnet test pieces can be used consistently without transferring of the magnet test pieces at the every steps, i.e., at the step of removing the oxide layer formed on the surface of each of the magnet test pieces, the step of forming the aluminum film on the surface of each of the magnet test piece by the vapor deposition process and the step of subjecting the aluminum film formed on the surface of each of the magnet test piece to the shot peening, and nevertheless, the occurrence of the cracking and breaking of the magnet test pieces other than the seven magnet test pieces each having a cracking and breaking can be inhibited.

Although the embodiments of the present invention have been described in detail, it will be understood that the present invention is not limited to the above-described embodiments, and various modifications in design may be made without departing from the spirit and scope of the invention defined in claims.

What is claimed is:

1. A process for treating surfaces of rare earth metal-based permanent magnets, comprising the steps of removing an oxide layer formed on a surface of each of the rare earth metal-based permanent magnets using a blasting apparatus which comprises a tubular barrel formed of a mesh net for accommodation of work pieces and supported circumferentially outside a center axis of a support member rotatable about said center axis, for rotation about said center axis, so that said tubular barrel can be rotated about said center axis of said support member by rotating said support member, and an injection nozzle disposed to inject a blast material against the work pieces from the outside of said tubular barrel rotated about said center axis, wherein at least one of said tubular barrel and said support member for supporting said tubular barrel is detachably mounted; removing said tubular barrel containing the rare earth metal-based permanent magnets with the oxide layers removed therefrom, or said support member for supporting said tubular barrel from said blasting apparatus; and attaching said tubular barrel or said support member to a vapor deposited film forming apparatus, where a metal film is formed on the surface of each of the rare earth metal-based permanent magnets by a vapor deposition process.

2. A process for treating the surfaces of rare earth metal-based permanent magnets according to claim 1, the process further including a step of removing the tubular barrel containing the rare earth metal-based permanent magnets having the metal films formed thereon, or the support member for supporting the tubular barrel from the vapor deposited film forming apparatus, and attaching said tubular barrel or said support member again to the blasting apparatus, where the metal films are subjected to a shot peening.

* * * * *